United States Patent
Kim et al.

(10) Patent No.: US 9,171,854 B2
(45) Date of Patent: Oct. 27, 2015

(54) SEMICONDUCTOR DEVICES INCLUDING VARIABLE WIDTH FLOATING GATES

(71) Applicants: HyoJoong Kim, Seongnam-si (KR); ByeongHoon Kim, Hwasung-si (KR); In-Young Kim, Hwasung-si (KR); Sang Bong Shin, Hwasung-si (KR); Songha Oh, Suwon-si (KR)

(72) Inventors: HyoJoong Kim, Seongnam-si (KR); ByeongHoon Kim, Hwasung-si (KR); In-Young Kim, Hwasung-si (KR); Sang Bong Shin, Hwasung-si (KR); Songha Oh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 128 days.

(21) Appl. No.: 13/966,511

(22) Filed: Aug. 14, 2013

(65) Prior Publication Data

US 2014/0138757 A1    May 22, 2014

(30) Foreign Application Priority Data

Nov. 16, 2012  (KR) .................... 10-2012-0130328

(51) Int. Cl.
*H01L 29/788* (2006.01)
*H01L 27/115* (2006.01)
*H01L 29/423* (2006.01)

(52) U.S. Cl.
CPC .... *H01L 27/11529* (2013.01); *H01L 27/11543* (2013.01); *H01L 29/42324* (2013.01); *H01L 29/7881* (2013.01)

(58) Field of Classification Search
CPC ............ H01L 2924/00; H01L 29/7881; H01L 27/11521; H01L 29/66825; H01L 2224/32225; H01L 21/28273; H01L 2224/48227; H01L 2224/73265; H01L 27/11524; H01L 9/42324; H01L 2224/73204; H01L 2224/16225
USPC ............. 257/316, E29.3, 315, 321, E21.422, 257/324, E27.081, 21.54, E27.06, E29.309, 257/296, 314, 326, E21.546, E29.255, 298, 257/E21.135, E21.159, E21.179, E21.19, 257/E21.269, E21.295, E21.421, E21.529, 257/E21.536, E21.573, E21.602, E21.645, 257/E23.011, E27.046, E29.068, E29.345, 257/202, 204, 29, 297, 300
See application file for complete search history.

(56) References Cited

U.S. PATENT DOCUMENTS

| 6,750,104 | B2 | 6/2004 | Blanchard et al. | |
| 7,157,332 | B2 | 1/2007 | Kwak | |
| 7,888,204 | B2 | 2/2011 | Jee et al. | |
| 8,383,496 | B2 | 2/2013 | Tonari et al. | |
| 2002/0115255 | A1* | 8/2002 | Shin et al. | 438/259 |
| 2004/0097080 | A1* | 5/2004 | Kim et al. | 438/689 |
| 2006/0194390 | A1 | 8/2006 | Imai et al. | |
| 2007/0023815 | A1* | 2/2007 | Oh et al. | 257/314 |

(Continued)

FOREIGN PATENT DOCUMENTS

| JP | 9-252060 A | 9/1997 |
| JP | 10-340893 A | 12/1998 |

(Continued)

*Primary Examiner* — Robert Bachner
(74) *Attorney, Agent, or Firm* — Myers Bigel Sibley & Sajovec, P.A.

(57) ABSTRACT

A semiconductor device includes a substrate including an active region defined by a device isolation pattern and a floating gate on the active region. The floating gate includes an upper portion, a lower portion having a width greater than a width of the upper portion, and a step-difference portion between the upper portion and the lower portion. A dielectric pattern is on the floating gate, and a control gate is on the dielectric pattern. The lower portion of the floating gate has a height of about 4 nm or more.

8 Claims, 13 Drawing Sheets

(56) References Cited

U.S. PATENT DOCUMENTS

2009/0261398 A1* 10/2009 Chien et al. .................. 257/316
2011/0250747 A1* 10/2011 Son et al. ..................... 438/594
2012/0001267 A1* 1/2012 Lee et al. ..................... 257/369
2012/0032246 A1* 2/2012 Honda et al. ................. 257/316
2012/0083105 A1 4/2012 Pellegrin

FOREIGN PATENT DOCUMENTS

| KR | 0121561 B1 | 8/1997 |
| KR | 10-0635201 B1 | 10/2006 |
| KR | 10-2007-0054033 A | 5/2007 |
| KR | 10-1111917 B1 | 1/2012 |

* cited by examiner

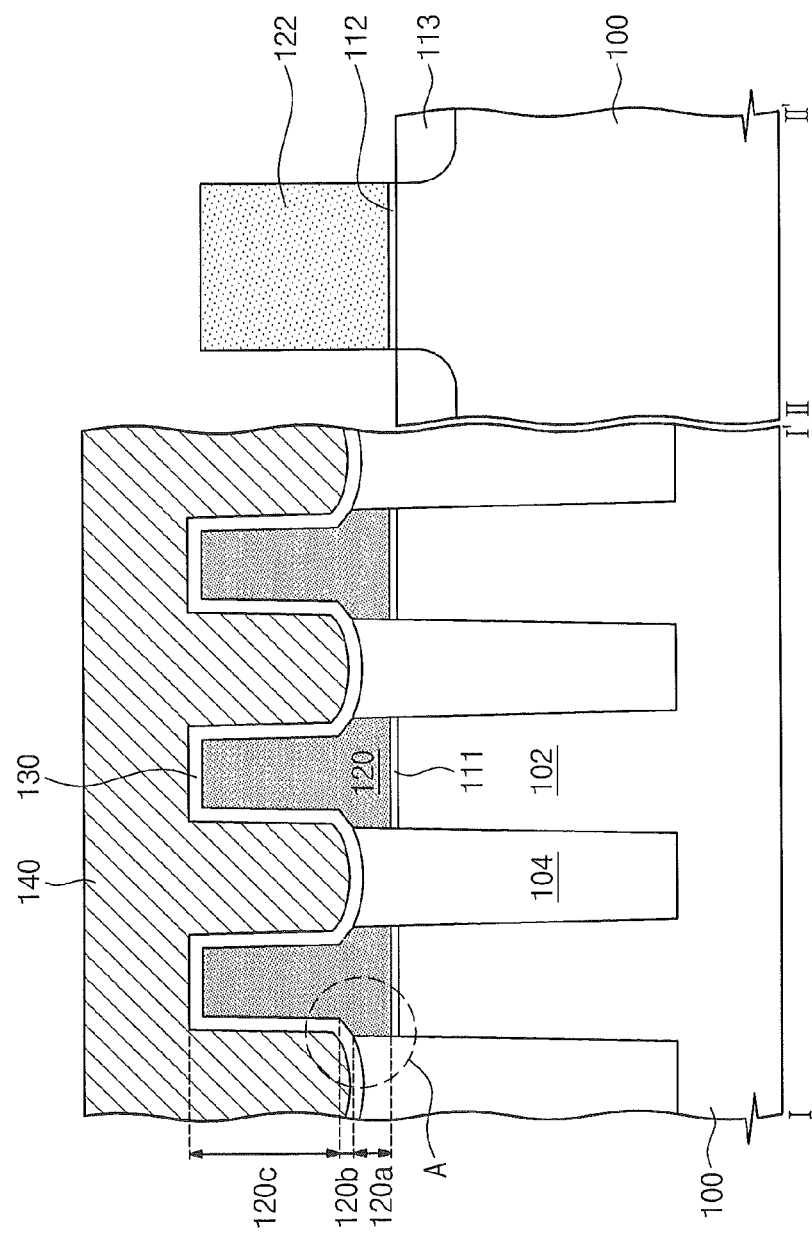

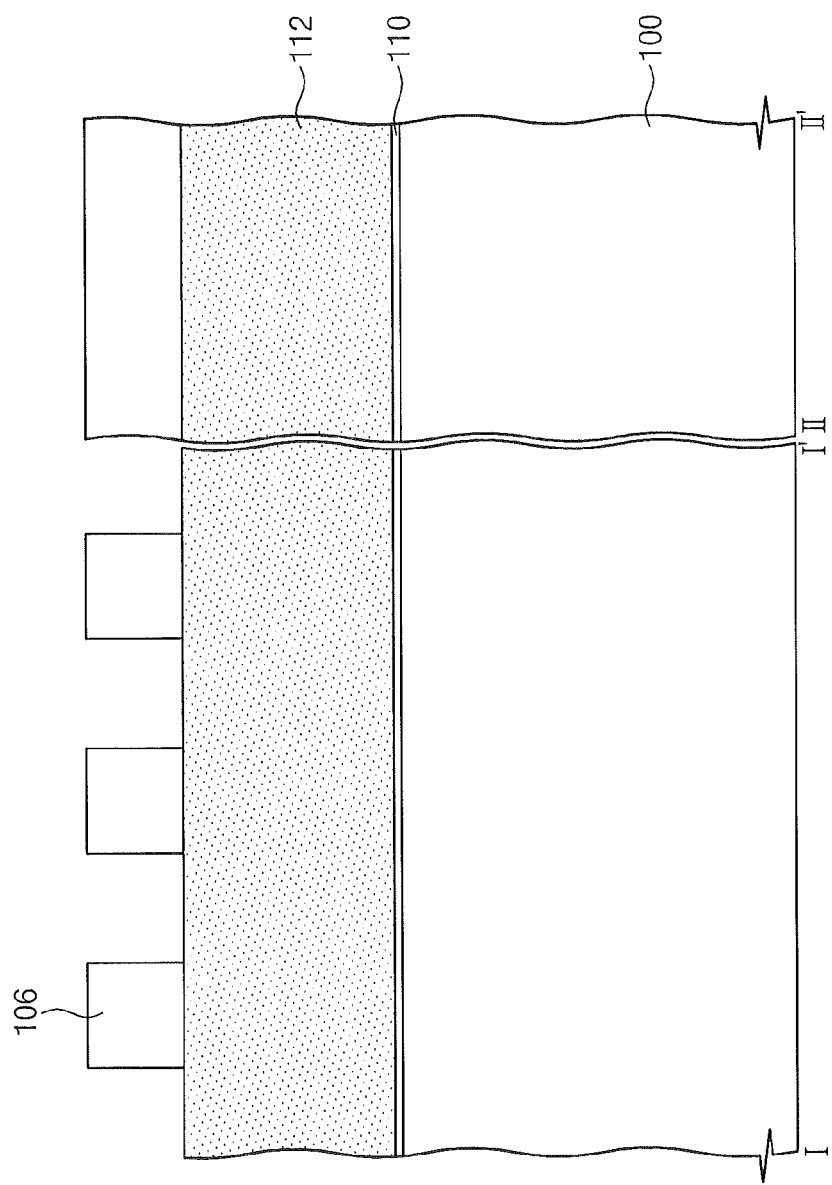

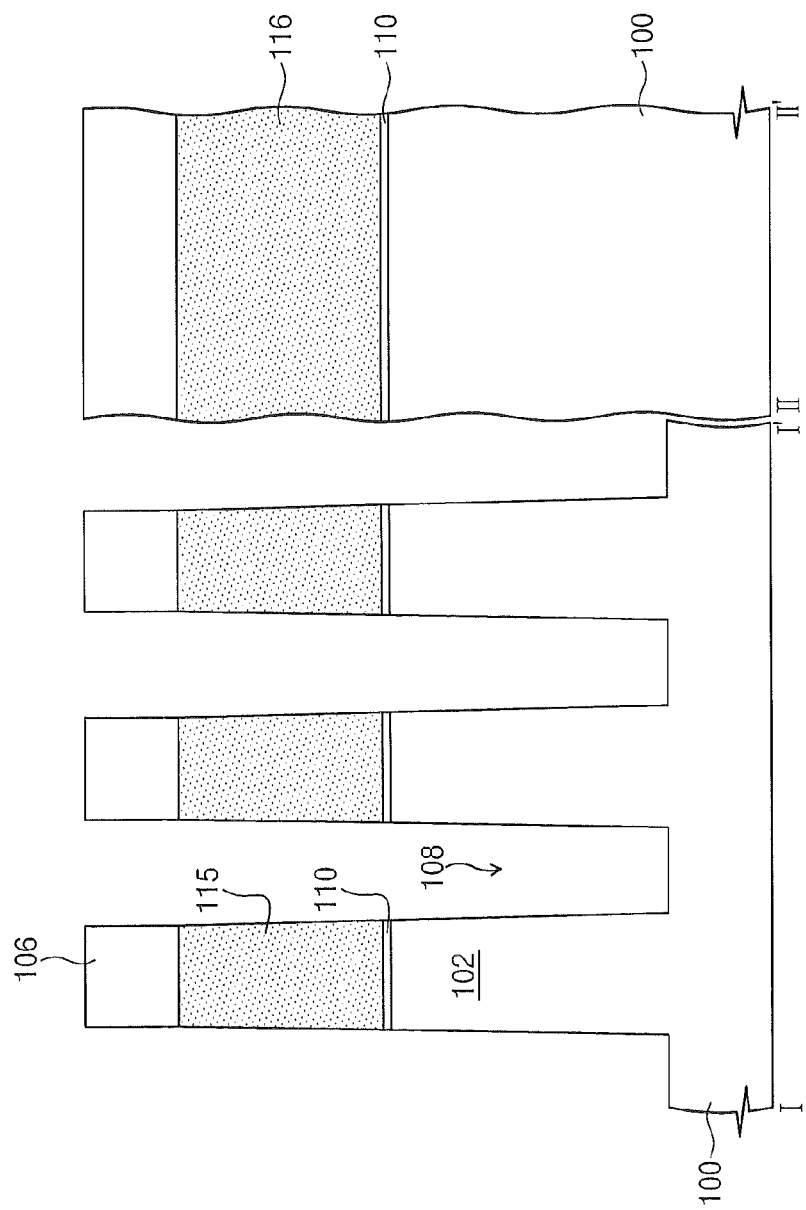

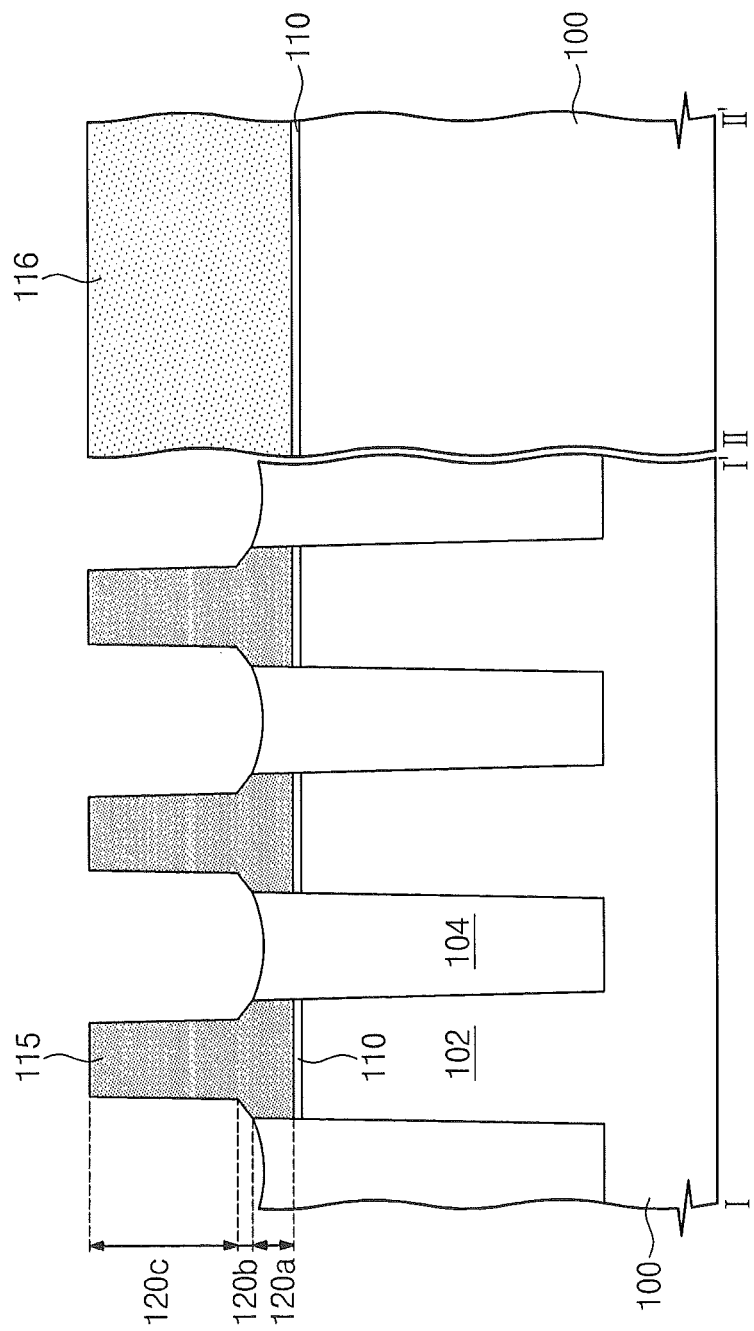

SEMICONDUCTOR DEVICES INCLUDING VARIABLE WIDTH FLOATING GATES

CROSS-REFERENCE TO RELATED APPLICATION

This U.S. non-provisional patent application claims priority under 35 U.S.C. §119 to Korean Patent Application No. 10-2012-0130328, filed on Nov. 16, 2012, the entirety of which is incorporated by reference herein.

BACKGROUND

The inventive concepts relate to semiconductor devices, methods of manufacturing the same, and apparatus for processing a substrate and, more particularly, to non-volatile memory devices, methods of manufacturing the same, and apparatus for processing a substrate.

Semiconductor devices have become increasingly integrated with the development of the microelectronics industry. Various problems (e.g., margin decrease of an exposure process) may occur, such that it may be increasingly difficult to manufacture semiconductor devices. Additionally, high speed semiconductor devices have been increasingly demanded with the development of the microelectronics industry. Research has been conducted for satisfying the demands for highly integrated and/or high speed semiconductor devices.

SUMMARY

Embodiments of the inventive concepts may provide highly integrated semiconductor devices.

Embodiments of the inventive concepts may also provide methods of manufacturing the semiconductor devices.

Embodiments of the inventive concepts may also provide apparatuses for processing the semiconductor devices.

In some aspects, a semiconductor device may include: a substrate including an active region defined by a device isolation pattern; a floating gate on the active region, the floating gate including an upper portion, a lower portion having a width greater than a width of the upper portion, and a step-difference portion between the upper portion and the lower portion; a dielectric pattern on the floating gate; and a control gate on the dielectric pattern. The lower portion of the floating gate may have a height of about 4 nm or more.

In some embodiments, the floating gate may include poly-silicon doped with p-type dopants.

In some embodiments, the p-type dopants may be boron (B).

In some embodiments, the floating gate may further include carbon (C).

In some embodiments, the step-difference portion may include an inclined surface.

In some embodiments, the inclined surface of the step-difference portion may have a concave curved surface.

In some embodiments, the inclined surface of the step-difference portion may be connected to a top surface of the device isolation pattern.

In some embodiments, a width of the lower portion of the floating gate may become progressively wider toward a bottom of the lower portion, and the lower portion of the floating gate may include a sidewall making a first inclination angle with an imaginary surface perpendicular to a top surface of the substrate. A width of the step-difference portion of the floating gate may become progressively wider toward a bottom of the step-difference portion, and the step-difference portion of the floating gate may include a sidewall making a second inclination angle with the imaginary surface perpendicular to the top surface of the substrate. A width of the upper portion of the floating gate may become progressively wider toward a bottom of the upper portion, and the upper portion of the floating gate may include a sidewall making a third inclination angle with the imaginary surface perpendicular to the top surface of the substrate. The second inclination angle may be greater than the first or third inclination angles.

In some embodiments, the first and third inclination angles may be substantially equal to each other.

In some embodiments, the device isolation pattern may include an upper portion protruding from a top surface of the substrate; and the protruding upper portion of the device isolation pattern may cover a sidewall of the lower portion of the floating gate.

In other aspects, a semiconductor device may include: a substrate including a cell area and a peripheral area, the substrate having an active region defined by a device isolation pattern; a floating gate disposed in the cell area, the floating gate including poly-silicon doped with carbon and first dopants of a p-type; a dielectric pattern and a control gate sequentially stacked on the floating gate; and a gate electrode disposed in the peripheral area, the gate electrode including poly-silicon doped with carbon and second dopants of the p-type.

In some embodiments, the floating gate may include: an upper portion; a lower portion having a width greater than a width of the upper portion; and a step-difference portion between the upper portion and the lower portion. The step-difference portion may include an inclined surface.

In some embodiments, the lower portion of the floating gate may have a height of about 4 nm or more.

In some embodiments, the inclined surface of the step-difference portion may include a concave curved surface.

In some embodiments, the device isolation pattern may include an upper portion on a sidewall of the lower portion of the floating gate and protruding from a top surface of the substrate.

In some embodiments, the inclined surface of the step-difference portion may be connected to a top surface of the device isolation pattern.

In some embodiments, the first and second dopants may be the same kind; and the first and second dopants may be boron (B).

In still other aspects, the semiconductor device comprises a substrate and a floating gate on the substrate. The floating gate includes an upper portion remote from the substrate and a lower portion that is wider than the upper portion, adjacent the substrate. A dielectric layer is on the floating gate, and a control gate is on the dielectric layer remote from the floating gate.

In some embodiments, the floating gate further comprises a step difference portion between the upper and lower portions.

In some embodiments, a device isolation region extends on a sidewall of a lower portion, up to but not onto a sidewall of the step difference portion. The device isolation region may include a curved outer surface.

In some embodiments, the lower portion is at least about 4 nm high.

In some embodiments, the floating gates comprises poly-silicon doped with boron and further includes carbon therein.

In some embodiments, the semiconductor device further comprises a gate electrode on the substrate that is free of a control gate thereon, wherein the floating gate and the gate electrode are doped p-type.

In still other aspects, a method of manufacturing a semiconductor device may include: forming a poly-silicon layer on a substrate; successively patterning the poly-silicon layer and the substrate to form a poly-silicon pattern and a trench; forming a device isolation pattern in the trench and extending on a sidewall of a lower portion of the poly-silicon pattern; performing a thermal treatment process on the poly-silicon pattern exposed by the device isolation pattern under an atmosphere of a reaction gas including first dopants of a p-type and an etching material; sequentially forming a dielectric layer and a conductive layer on the poly-silicon pattern and the device isolation pattern; and successively patterning the conductive layer, the dielectric layer, and the poly-silicon pattern to form a control gate, a dielectric pattern, and a floating gate.

In some embodiments, the poly-silicon layer formed on the substrate may include poly-silicon doped with second dopants of the p-type.

In some embodiments, the first and the second dopants may be the same kind; and the first and second dopants may be boron (B).

In some embodiments, the reaction gas may include chlorine (Cl) or fluorine (F).

In some embodiments, the reaction gas may include $BCl_3$ or $BF_3$.

In some embodiments, the reaction gas may further include nitrogen ($N_2$) gas.

In some embodiments, the thermal treatment process may be performed on the poly-silicon pattern at a temperature of about 500 degrees Celsius or more.

In some embodiments, the thermal treatment process may be performed on the poly-silicon pattern at a pressure of about 3 Torr or more.

In some embodiments, after performing the thermal treatment process, the method may further include: providing an oxygen ($O_2$) gas to purge the reaction gas remaining in a chamber in which the thermal treatment process is performed. The purging process may be performed at a temperature lower than a temperature of the thermal treatment process under a pressure lower than a pressure of the thermal treatment process.

In some embodiments, performing the thermal treatment process may include: additionally doping an exposed upper portion of the poly-silicon pattern with the first dopants of the p-type; and etching the exposed upper portion of the poly-silicon pattern.

In some embodiments, a surface area of the poly-silicon pattern after performing the thermal treatment process may be substantially equal to or less than about 90% of a surface area of the poly-silicon pattern before performing the thermal treatment process.

In yet other aspects, an apparatus for processing a substrate may include: a boat configured to hold a plurality of substrates; a vertical shape furnace configured to receive the boat and to heat the substrates held in the boat; a first gas supply connected to the vertical shape furnace, the first gas supply injecting a reaction gas including p-type dopants and an etching material into the vertical shape furnace; and a second gas supply connected to the vertical shape furnace, the second gas supply injecting an inert gas into the vertical shape furnace.

In some embodiments, the reaction gas may include $BCl_3$ or $BF_3$.

In some embodiments, the inert gas may include nitrogen ($N_2$) gas.

In some embodiments, the vertical shape furnace may be configured to heat the substrates at a temperature of about 500 degrees Celsius or more under a pressure of about 3 Torr or more.

BRIEF DESCRIPTION OF THE DRAWINGS

The inventive concepts will become more apparent in view of the attached drawings and accompanying detailed description.

FIGS. 3A through 3C are cross-sectional views illustrating a semiconductor device according to example embodiments of the inventive concepts;

FIGS. 4A through 4F are cross-sectional views illustrating a method of manufacturing a semiconductor device according to example embodiments of the inventive concepts;

DETAILED DESCRIPTION OF THE EMBODIMENTS

Figure 1:
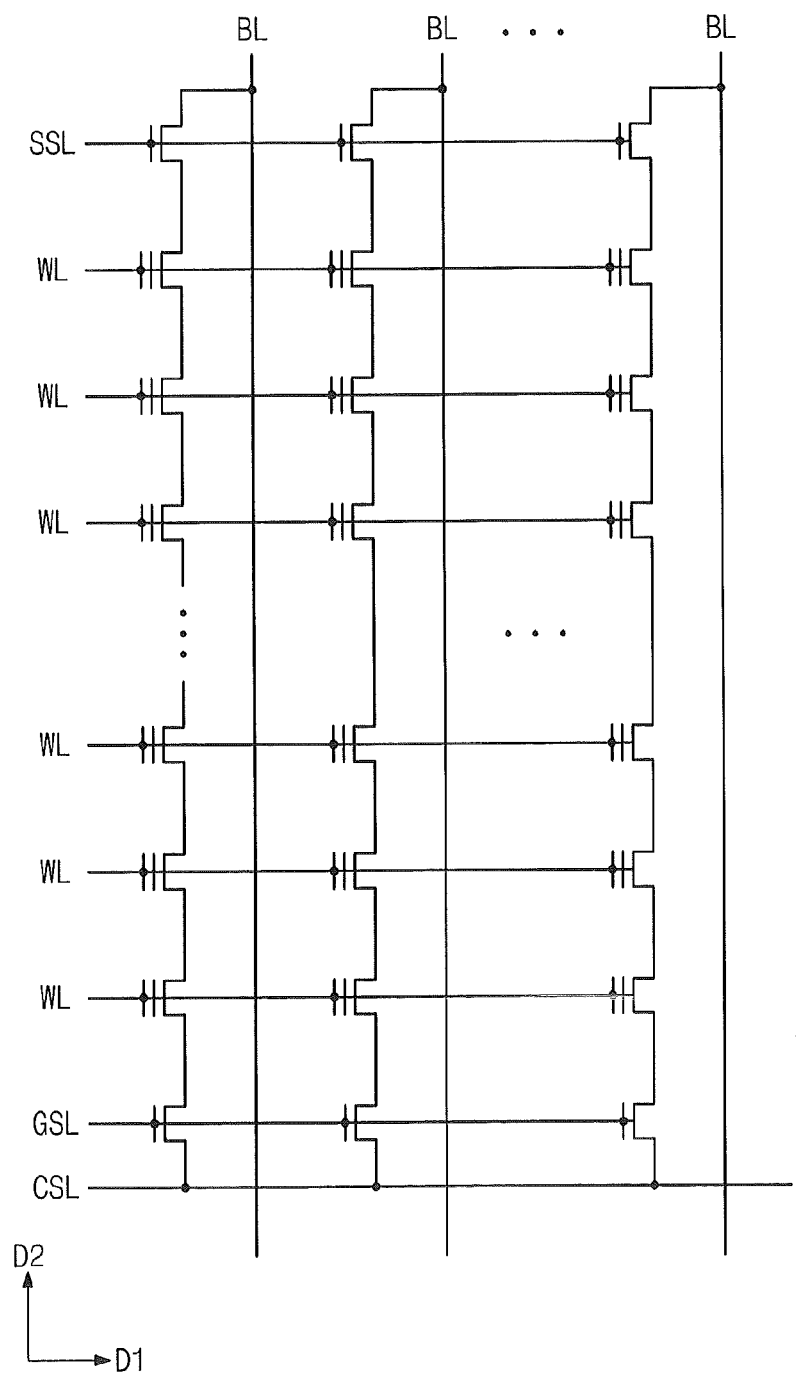
FIG. 1 is a circuit diagram of a semiconductor device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments, unless otherwise described herein.

Figure 2:
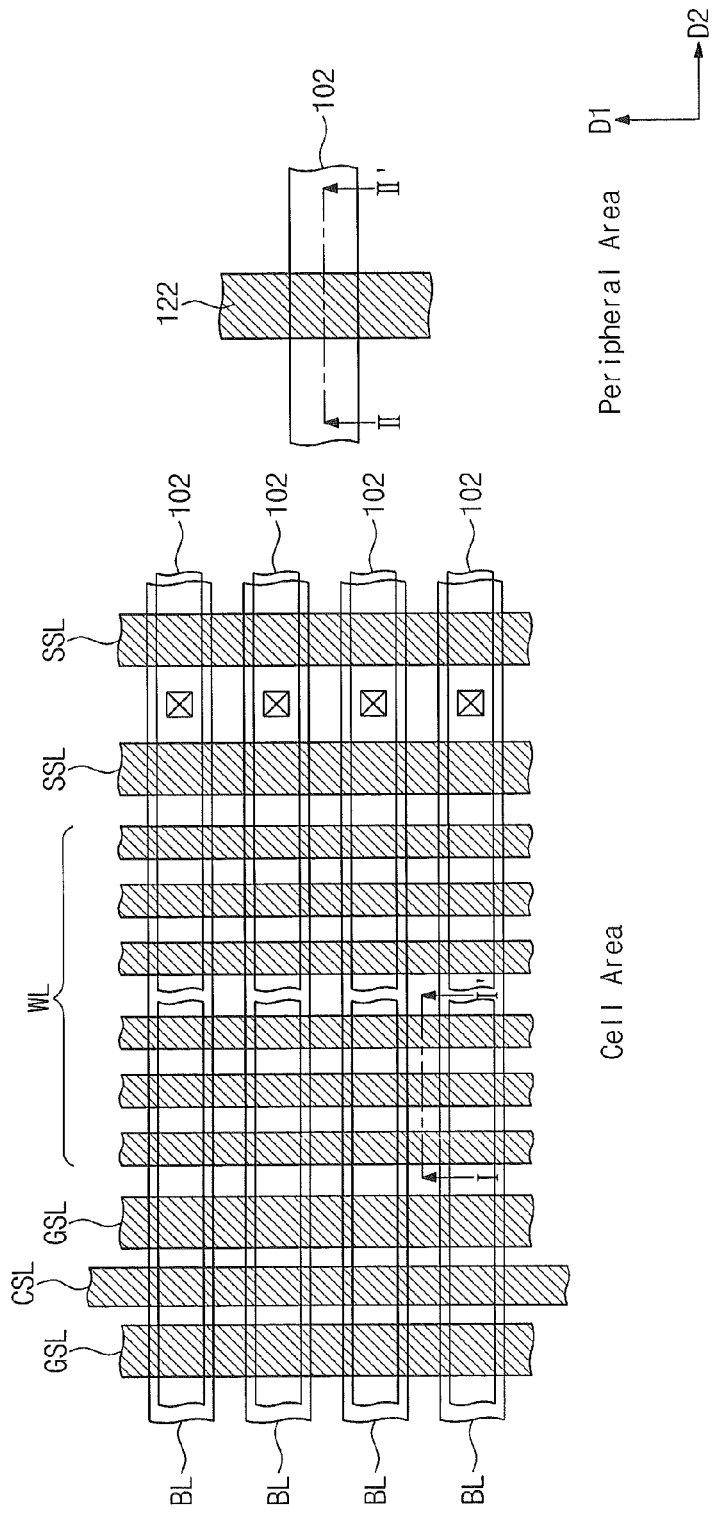
FIG. 2 is a plan view illustrating a semiconductor device according to example embodiments of the inventive concepts.

FIG. 1 is a circuit diagram of a semiconductor device according to example embodiments of the inventive concepts, and FIG. 2 is a plan view illustrating a semiconductor device according to example embodiments of the inventive concepts.

Referring to FIGS. 1 and 2, a semiconductor device according to embodiments of the inventive concepts may be a NAND flash memory device.

The NAND flash memory device may include a plurality of word lines WL and a plurality of bit lines BL. Each of the word lines WL may be connected in parallel to a plurality of memory cells. The word lines WL may extend in parallel to each other in a first direction D1.

The NAND flash memory device may include a plurality of memory cells and a plurality of selection lines. The selection lines may include a string selection line SSL and a ground selection line GSL.

A plurality of memory cells may be connected in series between the string selection line SSL and the ground selection line GSL to constitute a string. The bit lines BL may extend in parallel to each other in a second direction D2 different from the extending direction (i.e., the first direction D1) of the word line WL. For example, the word lines WL may be perpendicular to the bit lines BL. In other words, the first direction D1 may be perpendicular to the second direction D2.

Figure 3B:
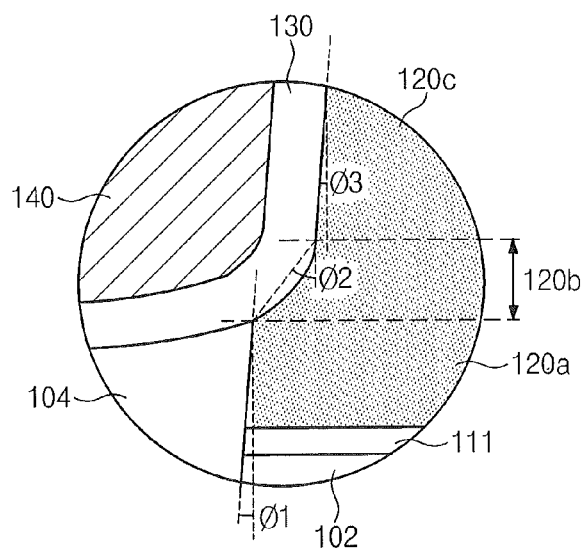
Figure 3C:
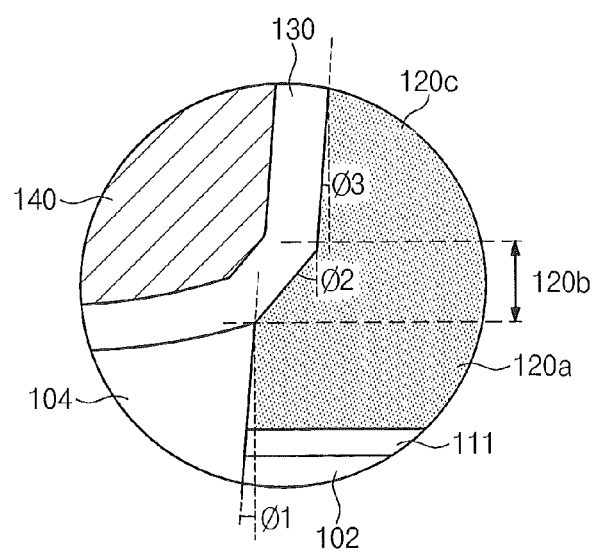

FIGS. 3A through 3C are cross-sectional views illustrating a semiconductor device according to example embodiments of the inventive concepts. FIG. 3A is a cross-sectional view taken along lines I-I' and II-II' of FIG. 2. FIGS. 3B and 3C are enlarged views of a portion 'A' of FIG. 3A.

Referring to FIG. 3A, a semiconductor device may include a substrate 100 including a cell area (left side) and a peripheral area (right side), a memory cell disposed on the substrate 100 of the cell area, and a peripheral transistor disposed on the substrate 100 of the peripheral area.

The substrate 100 may be a semiconductor substrate including silicon and/or germanium, a silicon-on-insulator (SOI) substrate, or a germanium-on-insulator (GOI) substrate. The substrate 100 may include a device isolation pattern 104 defining active regions 102.

The device isolation pattern 104 may include an insulating material such as an oxide, a nitride, and/or an oxynitride. According to some embodiments of the inventive concepts, the device isolation pattern 104 may have a structure filling a trench formed in the substrate 100. The device isolation pattern 104 of the cell area may include an upper portion protruding from a top surface of the substrate 100. The protruding upper portion of the device isolation pattern 104 may become progressively higher from its center part toward its edge part. The edge part of the upper portion of the device isolation pattern 104 may have a height of about 4 nm or more from the top surface of the substrate 100. The center part of the upper portion of the device isolation pattern 104 may have a height less than the height of the edge part of the upper portion of the device isolation pattern 104. Since the upper portion of the device isolation pattern 104 is higher than the top surface of the substrate 100, a damage of a tunnel insulating layer 111 described later may be suppressed.

The memory cell may include the tunnel insulating layer 111, a floating gate 120, a dielectric pattern 130, and a control gate 140. In some embodiments, the memory cell may be a memory cell of the NAND flash memory device.

The tunnel insulating layer 111 may include silicon oxide or a metal oxide. The metal oxide may include hafnium oxide ($Hf_xO_y$), aluminum oxide ($Al_xO_y$), zirconium oxide ($Zr_xO_y$), and/or zinc oxide ($Zn_xO_y$).

The floating gate 120 may be disposed on the tunnel insulating layer 111. The floating gate 120 may be insulated from the substrate 100 by the tunnel insulating layer 111 and may be insulated from the control gate 140 by the dielectric pattern 130.

The floating gate 120 may include poly-silicon doped with p-type dopants (i.e., p-doped poly-silicon). The p-type dopant may be boron (B). In some embodiments, the floating gate 120 may further include carbon (C). The carbon in the floating gate 120 may inhibit the boron in the floating gate 120 from being diffused.

A cross section of the floating gate 120 taken along a direction vertical to the top surface of the substrate 100 may have a substantially trapezoid shape in which a width becomes progressively wider toward a bottom surface of the floating gate 120. The floating gate 120 may include a lower portion 120a, a step-difference portion 120b, and an upper portion 120c.

The lower portion 120a of the floating gate 120 may be covered by the device isolation pattern 104. In more detail, the protruding upper portion of the device isolation pattern 104 may cover both sidewalls of the lower portion 120a of the floating gate 120, but may not extend onto a sidewall of the step-difference portion 120b. In an embodiment, a top surface of the upper portion of the device isolation pattern 104 may be a curved surface that is concave downward. The edge portion of the upper portion of the device isolation pattern 104 may cover the sidewall of the lower portion 120a of the floating gate 120. The lower portion 120a of the floating gate 120 covered by the upper portion of the device isolation pattern 104 may have a height of about 4 nm or more.

A width of the lower portion 120a of the floating gate 120 may become progressively wider toward a bottom surface of the lower portion 120a. The sidewall of the lower portion 120a of the floating gate 120 may have an inclined surface. A first inclination angle $\Phi1$ may be defined between the inclined surface of the sidewall of the lower portion 120a and an imaginary surface perpendicular to the top surface of the substrate 100.

The step-difference portion 120b of the floating gate 120 is disposed between the lower portion 120a and the upper portion 120c of the floating gate 120. A width of the step-difference portion 120b may be rapidly changed from the lower portion 120a to the upper portion 120c. The width of the step-difference portion 120b of the floating gate 120 may become progressively wider toward a bottom of the step-difference portion 120b. A sidewall of the step-difference portion 120b of the floating gate 120 may have an inclined surface. A second inclination angle Φ2 may be defined between the inclined surface of the sidewall of the step-difference portion 120b and the imaginary surface perpendicular to the top surface of the substrate 100. The second inclination angle Φ2 may be greater than the first inclination angle Φ1. The inclined surface of the step-difference portion 120b of the floating gate 120 may be connected to the top surface of the device isolation pattern 140.

In an embodiment illustrated in FIG. 3B, the sidewall of the step-difference portion 120b of the floating gate 120 may have a concave curved sidewall toward a center of the floating gate 120. In other words, the sidewall of the step-difference portion 120b may have a curvature. In more detail, the sidewall of the step-difference portion 120b may correspond to a portion of the circumference of an imaginary circle having a center disposed at the outside of the floating gate 120. In this case, the second inclination angle Φ2 may mean inclination of an imaginary flat surface connected between a top end and a bottom end of the concave sidewall of the step-difference portion 120b. In another embodiment illustrated in FIG. 3C, the sidewall of the step-difference portion 120b of the floating gate 120 may be flat.

The upper portion 120c of the floating gate 120 may extend upward from the step-difference portion 120b. A width of the upper portion 120c of the floating gate 120 may become progressively less toward a top surface of the upper portion 120c. In an embodiment, a sidewall of the upper portion 120c of the floating gate may have an inclined surface. A third inclination angle Φ3 may be defined between the inclined surface of the sidewall of the upper portion 120c and the imaginary surface perpendicular to the top surface of the substrate 100. The third inclination angle Φ3 may be substantially equal to the first inclination angle Φ1. In other words, the sidewall of the upper portion 120c of the floating gate may be parallel to the sidewall of the lower portion 120a of the floating gate.

The dielectric pattern 130 may be disposed on the floating gate 120. The dielectric pattern 130 may conformally extend along surfaces of the floating gates 120 adjacent to each other. Even through not shown in detail in the drawings, the dielectric pattern 130 may have a multi-layered structure including an oxide layer, a nitride layer, and an oxide layer that are sequentially stacked.

The control gate 140 may be disposed on the dielectric pattern 130. The control gate 140 may extend in the first direction (D1 of FIG. 2) which is substantially the same as an extending direction of the dielectric pattern 130. The control gate 140 may include doped poly-silicon, a metal, and/or a metal compound. The control gate 140 may have a single-layered or multi-layered structure.

The peripheral transistor may include a gate insulating pattern 112 and a gate electrode 122. In an embodiment, the peripheral transistors may be a logic transistor.

The gate insulating pattern 112 may correspond to the tunnel insulating layer 111 of the memory cell. The gate insulating pattern 112 may include the same material as the tunnel insulating layer 111.

The gate electrode 122 may correspond to the floating gate 120 of the memory cell. The gate electrode 122 may include the same material as the floating gate 120. For example, the gate electrode 122 may include poly-silicon doped with carbon and p-type dopants.

FIGS. 4A through 4F are cross-sectional views illustrating a method of manufacturing a semiconductor device according to example embodiments of the inventive concepts. FIGS. 4A through 4F are cross-sectional views illustrating a method of manufacturing a semiconductor device having a cross section taken along lines I-I' and II-II' of FIG. 2.

Referring to FIG. 4A, an insulating layer 110, a poly-silicon layer 112, and a mask 106 may be sequentially formed on a substrate 100. The substrate 100 may include a cell area (left side) and a peripheral area (right side).

The insulating layer 110 may include silicon oxide and/or a metal oxide. For example, the metal oxide may include hafnium oxide, aluminum oxide, zirconium oxide, and/or zinc oxide. In an embodiment, if the insulating layer 110 includes silicon oxide, the insulating layer 110 may be formed by a thermal oxidation process and/or a deposition process.

According to some embodiments of the inventive concepts, the poly-silicon layer 112 may be doped with p-type dopants. For example, the p-type dopant may be boron (B). In an embodiment, carbon may be added into the poly-silicon layer 112. A carbon concentration in the poly-silicon layer 112 may have a range of about 1% to about 10%. The carbon may capture the boron in the poly-silicon layer 112, so that over-diffusion of the boron may be inhibited.

According to other embodiments of the inventive concepts, the poly-silicon layer 112 may not be doped with impurities (e.g., p-type dopants and/or carbon).

The mask 106 may include a material having an etch selectivity with respect to the poly-silicon layer 112, the insulating layer 110, and the substrate 100. For example, the mask 106 may include silicon nitride.

Figure 4B:
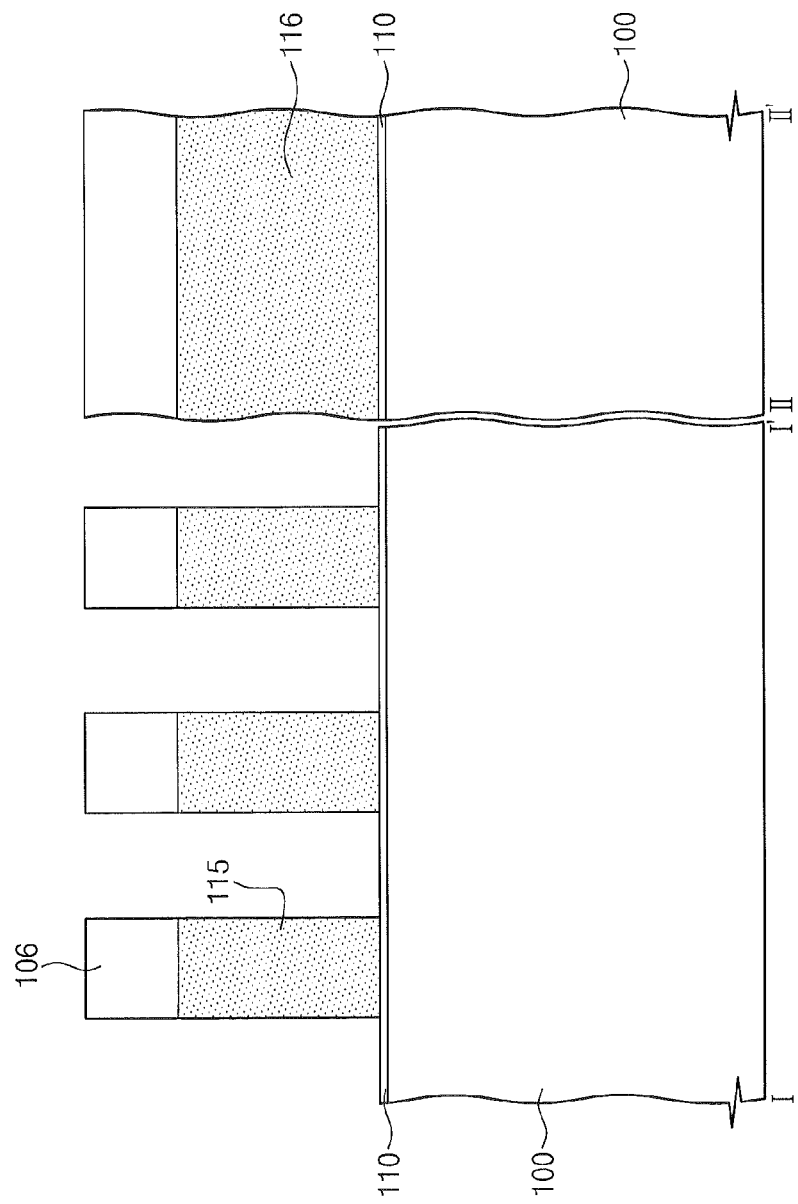

Referring to FIG. 4B, the poly-silicon layer 112 may be etched by an etching process using the mask 106 as an etch mask, so that first poly-silicon patterns 115 may be formed in the cell area and a second poly-silicon pattern 116 may be formed in the peripheral area.

Referring to FIG. 4C, the insulating layer 110 and the substrate 100 of the cell area may be successively etched by an etching process using the mask 106 and the first poly-silicon patterns 115 as etch masks, thereby forming a trench 108.

According to some embodiments of the inventive concepts, the etching processes for the formation of the poly-silicon patterns 115 and 116 and the trench 108 may be an anisotropic etching processes. Thus, a width of the trench 108 may become progressively less toward a bottom surface of the trench 108 due to properties of the anisotropic etching process. In response to this, a width of the first poly-silicon pattern 115 may become progressively wider toward a bottom surface of the first poly-silicon pattern 115. A cross section of the first poly-silicon pattern 115 taken along a direction perpendicular to the top surface of the substrate 100 may have a substantially trapezoid shape having a wide lower portion. A sidewall of the first poly-silicon pattern 115 may have an inclined surface. The inclined surface of the first poly-silicon pattern 115 may make a first inclination angle Φ1 with an imaginary surface perpendicular to the top surface of the substrate 10.

Figure 4D:
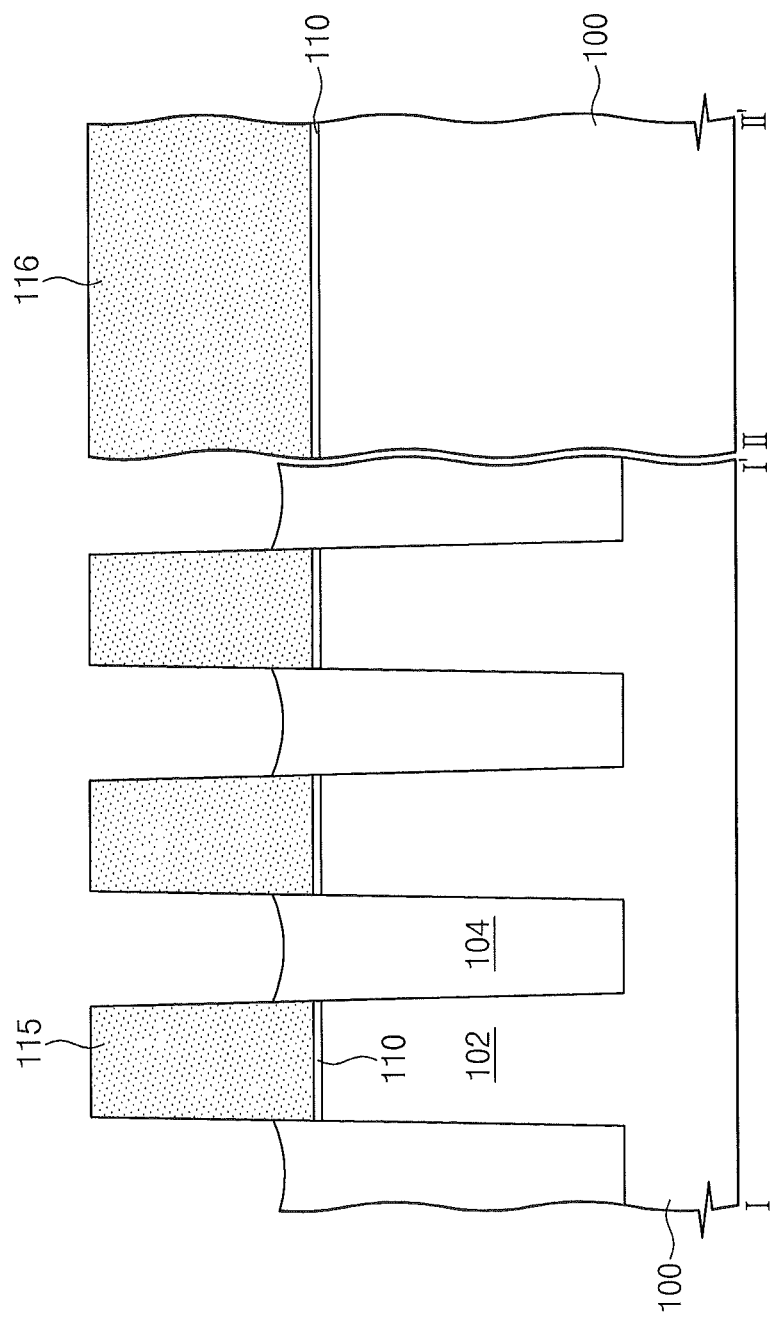

Referring to FIG. 4D, a device isolation pattern 104 may be formed to fill the trench 108. The device isolation pattern 104 may cover a lower portion of the first poly-silicon pattern 115. The device isolation pattern 104 may include a lower portion filling the trench 108 and an upper portion protruding upward from the top surface of the substrate 100. Meanwhile, the mask 106 may be removed during the formation of the device isolation pattern 104.

The formation process of the device isolation pattern 104 will be described briefly. A device isolation layer (not shown) may be formed to fill the trench 108. The device isolation layer may be etched until the mask 106 is exposed, and then the mask 106 and the device isolation layer may be further etched until a top surface of the first poly silicon pattern 115 is exposed. Subsequently, the device isolation layer may be etched to expose an upper portion of the first poly-silicon pattern 115 and to form the device isolation pattern 104 covering the lower portion of the first poly-silicon pattern 115. A top surface of the device isolation pattern 104 may be formed to have a concave shape due to the properties of the etching process for the formation of the device isolation pattern 104. The upper portion of the device isolation pattern 104 may have a height becoming progressively wider from its center part toward its edge part. The lower portion of the first poly-silicon pattern 115 may be covered by the edge part of the upper portion of the device isolation pattern 104. The edge part of the upper portion of the device isolation pattern 104 may have a height of about 4 nm, or more, and the lower portion of the first poly-silicon pattern 115 covered by the device isolation pattern 104 may have a height of about 4 nm or more. Since the upper portion of the device isolation pattern 104 is higher than the top surface of the substrate 100, it is possible to reduce or prevent the insulating layer 110 under the first poly-silicon pattern 115 from being exposed. Since the insulating layer 110 is not exposed, damage of the insulating layer 110 caused in subsequent processes may be suppressed.

In an embodiment, the device isolation layer may be formed to completely fill the trench 108. In this case, the device isolation layer may include an insulating material having excellent gap-filling ability. For example, the device isolation layer may include a high density plasma (HDP) oxide.

In another embodiment, the device isolation layer may partially fill the trench 108, so that an air gap (not shown) may be formed in the trench 108. The air gap may not be exposed during etching of the device isolation layer. In this case, the device isolation layer may include, for example, a low temperature silicon oxide.

Referring to FIG. 4E, the first poly-silicon pattern 115 exposed by the device isolation pattern 104 may be thermally treated under a reaction gas atmosphere.

According to some embodiments of the inventive concepts, the reaction gas may include p-type dopants and an etching material. In an embodiment, the reaction gas may include $BCl_3$ or $BF_3$. In another embodiment, the reaction gas may further include an inert gas such as a nitrogen ($N_2$) gas.

The thermal treatment process of the first poly-silicon pattern 115 may be performed at a temperature of about 500 degrees Celsius or more under a pressure of about 3 Torr or more. If the thermal treatment process is performed at a temperature lower than about 500 degrees Celsius, the reaction gas may not react with the first poly-silicon pattern 115.

During the thermal treatment process, the p-type dopants may be diffused into the first poly-silicon pattern 115, and the etching material of the reaction may isotropically etch the first poly-silicon pattern 115. If the reaction gas includes the $BCl_3$ gas, the $BCl_3$ gas may be decomposed into $B^+$ ions and $Cl^-$ ions at the temperature of about 500 degrees Celsius or more. The decomposed $B^+$ ions may be diffused into the first poly-silicon pattern 115. The decomposed ions may be combined with silicon atoms of a surface of the upper portion of the first poly-silicon pattern 115 to form $SiCl_4$ of gaseous state, so that the exposed surface of the upper portion of the first poly-silicon pattern 115 may be etched.

In more detail, the poly-silicon layer 112 of FIG. 4A is doped with p-type dopants. Some of the p-type dopants in poly-silicon layer 112 may escape from the poly-silicon layer 112 during the processes described with reference to FIGS. 4B, 4C, and 4D, so that a concentration of the p-type dopants in the first poly-silicon pattern 115 may be lower than a desired concentration. However, the concentration of the p-type dopants in the first poly-silicon pattern 115 may increase to the desired concentration by the thermal treatment process described above.

If p-type dopants are injected into the first poly-silicon pattern 115 by a general ion implantation method for increasing the concentration of the p-type dopants in the first poly-silicon pattern 115, the first poly-silicon pattern 115 having a narrow width may lean during the ion implantation process. However, according to the embodiments of the inventive concepts, the first poly-silicon pattern 115 is doped with additional p-type dopants by the thermal treatment process including a thermal diffusion process. Thus, the leaning problem of the first poly-silicon pattern 115 may be reduced or prevented.

Additionally, the etching material of the reaction gas may isotropically etch the exposed upper portion of the first poly-silicon pattern 115 during the thermal treatment process. In an embodiment, the etching material of the reaction gas may include chlorine (Cl) or fluorine (F), and the chlorine or fluorine may react with silicon (Si) of the surface of the first poly-silicon pattern 115 to form a gas such $SiCl_4$ or $SiF_4$. As a result, the first poly-silicon pattern 115 may be isotropically etched. For example, a surface area of the first poly-silicon pattern etched by the thermal treatment process may be equal to or less than about 90% of a surface area of the first poly-silicon pattern before the thermal treatment process.

In an embodiment, a step-difference portion 120b may be formed between the lower portion 120a of the first poly-silicon pattern covered by the device isolation pattern 104 and an upper portion 120c of the first poly-silicon pattern etched by the isotropic etching of the thermal treatment process. As described above, the lower portion 120a of the first poly-silicon pattern may include a sidewall having the first inclination angle $\Phi 1$ of FIGS. 3B and 3C, the step-difference portion 120b of the first poly-silicon pattern may include a sidewall having the second inclination angle $\Phi 2$ of FIGS. 3B and 3C, and the upper portion 120c of the first poly-silicon pattern may include a sidewall having the third inclination angle $\Phi 3$ of FIGS. 3B and 3C. Since the etching process of the thermal treatment process is an isotropic etching process, the first inclination angle $\Phi 1$ may be substantially equal to the third inclination angle $\Phi 3$. The second inclination angle $\Phi 2$ may be greater than the first inclination angle $\Phi 1$.

In an embodiment, the inclined surface (i.e., the inclined sidewall) of the step-difference portion 120b of the first poly-silicon pattern may be connected to the top surface of the device isolation pattern 104.

On the other hand, while the thermal treatment process is performed on the cell area, the thermal treatment process may also be performed on the second poly-silicon pattern 116 of the peripheral area. Thus, a concentration of the p-type dopants in the second poly-silicon pattern 116 may also increase.

As described above, since the upper portion of the first poly-silicon pattern 115 is etched, a distance between the first poly-silicon patterns 115 adjacent to each other may increase after the thermal treatment process. Thus, electrical problems (e.g., a short) between the adjacent first poly-silicon patterns 115 may be reduced or prevented, and an interference phenomenon between the first poly-silicon patterns 115 may be reduced or prevented.

In an embodiment, after the thermal treatment process is performed, an oxygen ($O_2$) gas may be injected into a chamber where the thermal treatment process is performed, so that the reaction gas remaining in the chamber may be purged. The purging process may be performed at a temperature lower than the temperature of the thermal treatment process under a pressure lower than the pressure of the thermal treatment process.

In an embodiment, the thermal treatment process may be performed in batch type. An apparatus for performing the batch type thermal treatment process will be described in detail later. In another embodiment, the thermal treatment process may be performed in single wafer type.

Figure 4F:
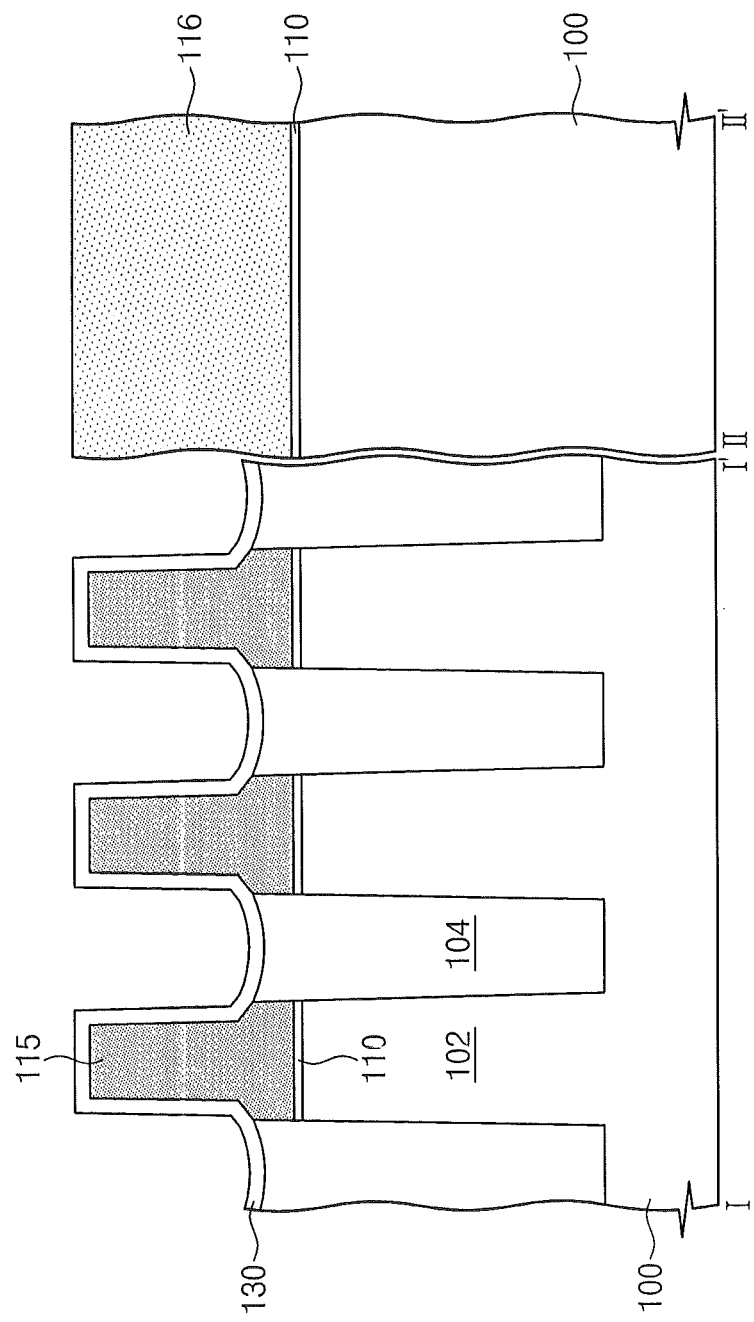

Referring to FIG. 4F, a dielectric layer 130 may be conformally formed on the first poly-silicon patterns 115 and the second poly-silicon pattern 116. The dielectric layer 130 may not fill a space between the first poly-silicon patterns 115 adjacent to each other.

The dielectric layer 115 may have a multi-layered structure. For example, the dielectric layer 115 may include an oxide layer, a nitride layer, and an oxide layer that are sequentially stacked.

The dielectric layer 130 on the second poly-silicon pattern 116 may be removed.

Referring again to FIG. 3A, a conductive layer (not shown) may be formed on the dielectric layer 130. The conductive layer may include poly-silicon doped with dopants, a metal, and/or a metal compound.

The conductive layer, the dielectric layer 130, and the first poly-silicon pattern 115 of the cell area may be successively patterned to form the control gate 140 extending in a first direction D1 of FIG. 2, the dielectric pattern 130, and the floating gate 120. As a result, the memory cell may be formed to include the tunnel insulating layer 111, the floating gate 120, the dielectric pattern 130, and the control gate 140 in the cell area.

The conductive layer and the second poly-silicon pattern 116 of the peripheral area may be successively patterned to form the gate electrode 122 including a portion of the second poly-silicon pattern 116. The gate insulating pattern 112 may be formed between the gate electrode 122 and the substrate 100. Additionally, source/drain regions 113 may be formed in the substrate 100 at both sides of the gate electrode 122.

As described above, since the distance between the upper portions of the adjacent first poly-silicon patterns 115 increases by the thermal treatment process, a void and/or a seam may not be formed in the conductive layer during the formation of the conductive layer. Thus, electrical reliability of the completed memory cell may be improved.

Figure 5:
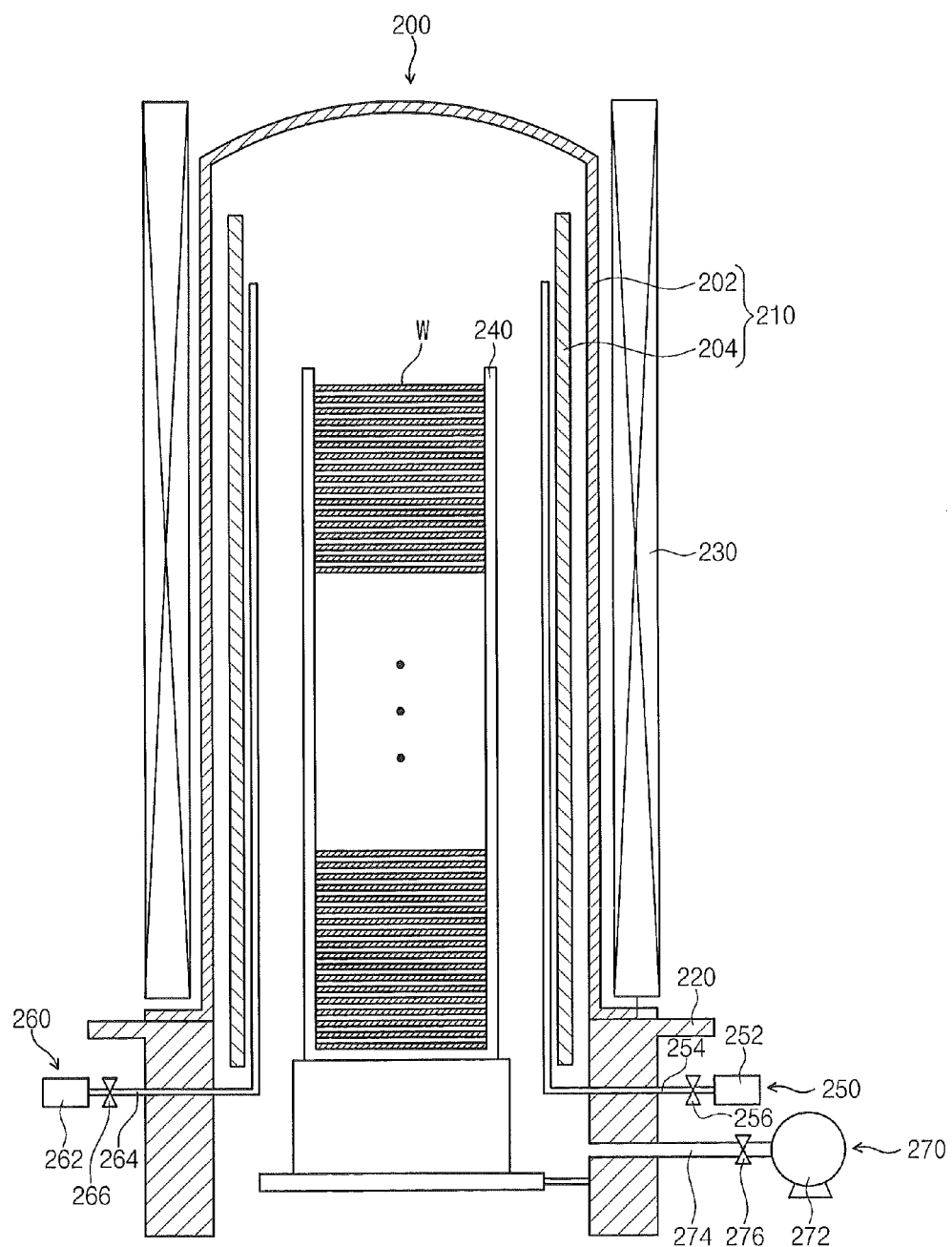
FIG. 5 is a cross-sectional view illustrating an apparatus for processing a substrate according to example embodiments of the inventive concepts.

FIG. 5 is a cross-sectional view illustrating an apparatus for processing a substrate according to example embodiments of the inventive concepts.

Referring to FIG. 5, a processing apparatus 200 may include a vertical shape furnace 210, a manifold 220, a heating part 230, a boat 240, a first gas supply part 250, and a second gas supply part 260.

The vertical shape furnace 210 may include an inner tube 204 and an outer tube 202 surrounding the inner tube 204. The inner and outer tubes 204 and 202 may be formed of quartz. The inner tube 204 may be disposed in the inside of the outer tube 202. The inner tube 204 may be spaced apart from the outer tube 202 by a predetermined distance. The outer tube 202 may have a cylindrical shape of which a bottom is opened. The opened bottom of the outer tube 202 may be connected to an upper region of the manifold 220. The inner tube 204 may have a cylindrical shape of which a bottom and a top are opened. The boat 240 may be received in the inner tube 204.

The manifold 220 may have a cylindrical shape of which a bottom and a top are opened. A shutter (not shown) movable in a horizontal direction may be disposed at the bottom of the manifold 220. The bottom of the manifold 220 may be closed using the shutter. Thus, inflow of air may be blocked, such that an inner space of the outer tube 202 may be sealed. The thermal treatment process described with reference to FIG. 4E may be performed in the sealed inner space of the outer tube 202.

The heating part 230 may be spaced apart from the outer tube 202 and may surround the outer tube 202. The heating part 230 may provide heat to the vertical shape furnace 210.

The boat 240 may receive a plurality of substrates W in a multistage manner. The boat 240 may be mainly formed of quartz. The boat 240 may include a plurality of supporting rods (not shown) extending in up and down directions. A plurality of slots (not shown) for supporting the wafers W may be formed at the supporting rods. Even though not shown in detail in the drawings, the apparatus may include an elevating unit for moving the boat 240 into the vertical shape furnace 210.

The first gas supply part 250 may be installed at a first side of the manifold 220. The first gas supply part 250 may be connected to the inner space of the vertical shape furnace 210. The first gas supply part 250 may include a first gas tank 252 storing a reaction gas, a first gas line 254 connected to the first gas tank 252 and the first side of the manifold 220, and a first gas valve 256 installed on the first gas line 254 for controlling a flow rate of the reaction gas. The reaction gas stored in the first gas tank 252 may include p-type dopants and an etching material. In an embodiment, $BCl_3$ or $BF_3$ may be used as the reaction gas.

The second gas supply part 260 may be installed at a second side of the manifold 220. The second gas supply part 260 may be connected to the inner space of the vertical shape furnace 210. The second gas supply part 260 may include a second gas tank 262 storing an inert gas, a second gas line 264 connected to the second gas tank 262 and the second side of the manifold 220, and a second gas valve 266 installed on the second gas line 264 for controlling a flow rate of the inert gas. The inert gas stored in the second gas tank 262 may include a nitrogen ($N_2$) gas.

The apparatus 200 may further include a vacuum providing part 270 installed at a side of the manifold 220 and connected to the vertical shape furnace 210. The vacuum providing part 270 may include a pump 272, a vacuum line 274, and a vacuum valve 276. The pump 272 may be provided for exhausting an unreacted gas or a byproduct gas and for generating a desired pressure in the inner space of the vertical shape furnace 210. The vacuum line 274 may connect the pump 272 to the inner space of the vertical shape furnace 210. The vacuum valve 276 may be installed on the vacuum line 274 for controlling the pressure of the inner space of the vertical shape furnace 210.

The thermal treatment process using the apparatus 200 will be described hereinafter.

Substrates W having the resultant structures of FIG. 4D may be loaded in the boat 240. The boat 240 having the substrates W may be moved into the inner tube 204 of the vertical shape furnace 210. The shutter may be horizontally moved to close the bottom of the manifold 220, such that the inner space of the vertical shape furnace 210 may be sealed.

The desired process pressure may be generated in the inner space of the vertical shape furnace 210 by the vacuum providing part 270. In an embodiment, the process pressure may be greater than about 3 Torr. Additionally, a temperature of the inner space may be changed into a desired process temperature by the heating part 230. In an embodiment, the process temperature may be greater than about 500 degrees Celsius.

The reaction gas may be provided into the vertical shape furnace 210 by the first gas supply part 250. In an embodiment, the reaction gas may include $BCl_3$ or $BF_3$. The inert gas may be further provided into the vertical shape furnace 210 by the second gas supply part 260. In an embodiment, the inert gas may include nitrogen ($N_2$) gas.

The reaction gas is provided into the vertical shape furnace 210 at the process temperature under the process pressure, such that the upper portion of the first poly-silicon pattern 115 of FIG. 4E may be doped with the p-type dopants and be etched at the same time, as described with reference to FIG. 4E.

For example, if the reaction gas includes $BCl_3$, the $BCl_3$ gas may be decomposed into $B^+$ ions and $Cl^-$ ions at the temperature of about 500 degrees Celsius or more. The decomposed $B^+$ ions may be diffused into the first poly-silicon pattern 115 of FIG. 4E. The decomposed $Cl^-$ ions may be combined with silicon atoms of the surface of the upper portion of first poly-silicon pattern 115 of FIG. 4E to form $SiCl_4$ of a gaseous state, so that the surface of the upper portion of the first poly-silicon pattern 115 may be etched.

After the thermal treatment process is performed, an oxygen ($O_2$) gas may be injected into the vertical shape furnace 210 to purge an etch byproduct (e.g., $SiCl_4$) and the reaction gas remaining in the vertical shape furnace 210. The purging process may be performed at a temperature lower than the process temperature under a pressure lower than the process pressure.

(Applications)

Figure 6A:
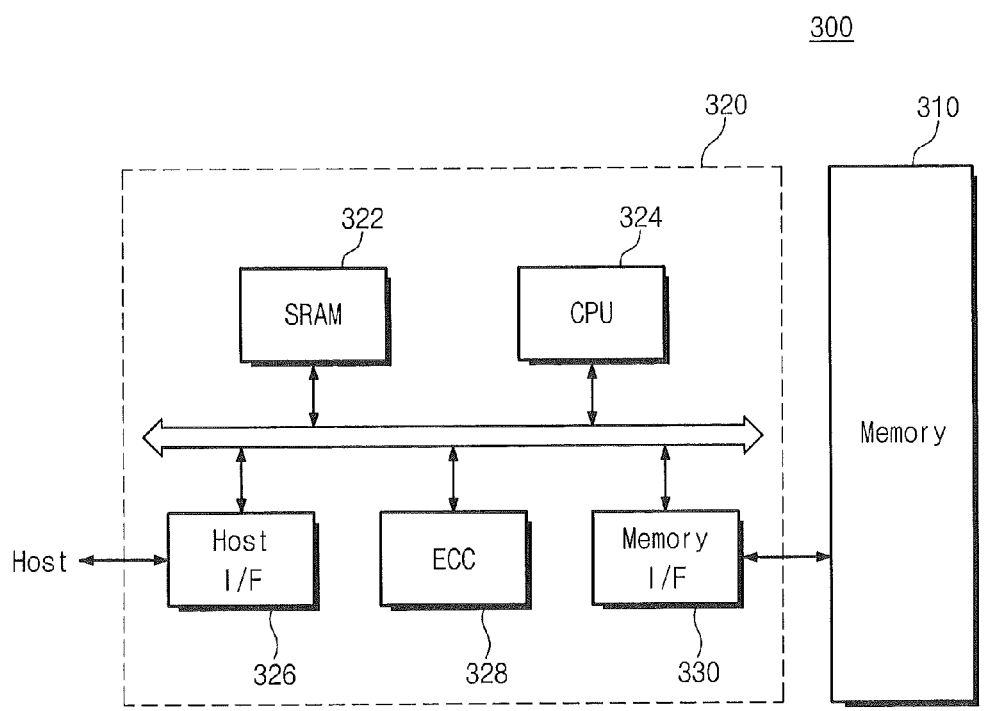
FIG. 6A is a schematic block diagram illustrating an example of memory cards including semiconductor devices according to example embodiments of the inventive concepts.

FIG. 6A is a schematic block diagram illustrating an example of memory cards including semiconductor devices according to example embodiments of the inventive concepts.

Referring to FIG. 6A, the semiconductor device according to the aforementioned embodiments may be applied to a memory card 300. For example, the memory card 300 may include a memory controller 320 that controls data communication between a host and a memory device 310. A static random access memory (SRAM) device 322 may be used as an operation memory of a central processing unit (CPU) 324. A host interface unit 326 may be configured to include a data communication protocol between the memory card 300 and the host. An error check and correction (ECC) block 328 may detect and correct errors of data which are read out from the memory device 310. A memory interface unit 330 may interface with the memory device 310. The CPU 324 controls overall operations of the memory controller 324.

The memory device 310 in the memory card 300 may include the semiconductor device according to the aforementioned embodiments of the inventive concepts. Thus, the dopant concentration may be suitably maintained in the floating gate, and a short between the floating gates adjacent to each other may be reduced or prevented.

Figure 6B:
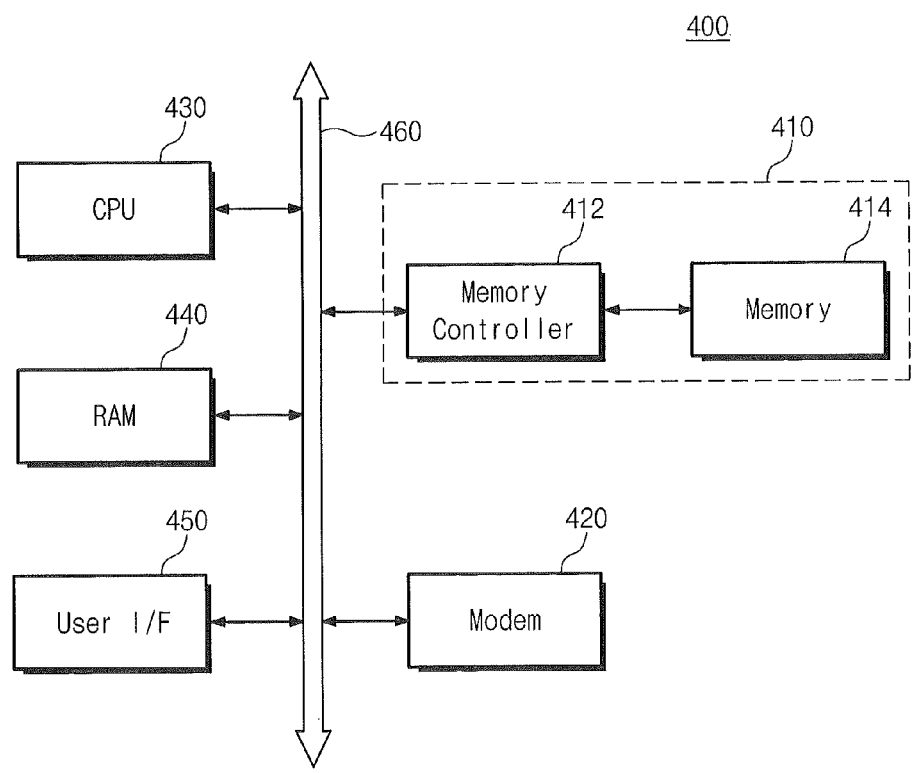
FIG. 6B is a schematic block diagram illustrating an example of systems including semiconductor devices according to example embodiments of the inventive concepts.

FIG. 6B is a schematic block diagram illustrating an example of systems including semiconductor devices according to example embodiments of the inventive concepts.

Referring to FIG. 6B, an information processing system 400 may include the semiconductor device according to the embodiments described above. The information processing system 400 may include a mobile device or a computer. For example, the information processing system 400 may include a modem 420, a central processing unit (CPU) 430, a random access memory (RAM) 440, and a user interface unit 450 that are electrically connected to a memory system 410 through a system bus 460. The memory system 410 may store data processed by the CPU 430 or data inputted from an external system. The memory system 410 may include a memory device 412 and a memory controller 414. The memory system 410 may have substantially the same structure as the memory card 400 described with reference to FIG. 6A. The information processing system 400 may be realized as a memory card, a solid state disk (SSD) device, a camera image sensor and another type of application chipset. For example, the memory system 410 may consist of the SSD device. In this case, the information processing system 400 may stably and reliably store massive data.

According to embodiments of the inventive concepts, the distance between the adjacent floating gates may increase, and the floating gate may have the sufficient concentration of the dopants. Thus, the electrical reliability of the semiconductor device including the floating gates may be improved.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A semiconductor device comprising:
    a substrate including an active region defined by a device isolation pattern;
    a floating gate on the active region, the floating gate including an upper portion, a lower portion having a width greater than a width of the upper portion, and a step-difference portion between the upper portion and the lower portion;
    a dielectric pattern on the floating gate; and
    a control gate on the dielectric pattern,
    wherein a width of the lower portion of the floating gate becomes progressively wider toward a bottom of the lower portion;
    wherein the lower portion of the floating gate includes a sidewall making a first inclination angle with an imaginary surface perpendicular to a top surface of the substrate;
    wherein a width of the step-difference portion of the floating gate becomes progressively wider toward a bottom of the step-difference portion;
    wherein the step-difference portion of the floating gate includes a sidewall making a second inclination angle with the imaginary surface perpendicular to the top surface of the substrate;
    wherein a width of the upper portion of the floating gate becomes progressively wider toward a bottom of the upper portion;
    wherein the upper portion of the floating gate includes a sidewall making a third inclination angle with the imaginary surface perpendicular to the top surface of the substrate; and
    wherein the second inclination angle is greater than the first or third inclination angles.

2. The semiconductor device of claim 1, wherein the floating gate includes poly-silicon doped with p-type dopants.

3. The semiconductor device of claim 2, wherein the p-type dopants are boron (B).

4. The semiconductor device of claim 3, wherein the floating gate further includes carbon (C).

5. The semiconductor device of claim 1, wherein the sidewall of the step-difference portion has a concave curved surface.

6. The semiconductor device of claim 1, wherein the sidewall of the step-difference portion is connected to a top surface of the device isolation pattern.

7. The semiconductor device of claim 1, wherein the first and third inclination angles are substantially equal to each other.

8. The semiconductor device of claim 1, wherein the device isolation pattern includes an upper portion protruding from the top surface of the substrate; and
   wherein the protruding upper portion of the device isolation pattern covers the sidewall of the lower portion of the floating gate.

* * * * *